(12) United States Patent
Lee et al.

(10) Patent No.: US 10,756,021 B2
(45) Date of Patent: Aug. 25, 2020

(54) SEMICONDUCTOR PACKAGE

(71) Applicant: SAMSUNG ELECTRONICS CO., LTD., Suwon-si (KR)

(72) Inventors: Ki Ju Lee, Suwon-si (KR); Jin Su Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 22 days.

(21) Appl. No.: 15/972,820

(22) Filed: May 7, 2018

(65) Prior Publication Data

US 2019/0122991 A1 Apr. 25, 2019

(30) Foreign Application Priority Data

Oct. 19, 2017 (KR) .................. 10-2017-0135951

(51) Int. Cl.
*H01L 23/538* (2006.01)
*H01L 23/31* (2006.01)
(Continued)

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3114* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2224/214* (2013.01); *H01L 2924/1431* (2013.01); *H01L 2924/1433* (2013.01); *H01L 2924/1436* (2013.01);
(Continued)

(58) Field of Classification Search
CPC combination set(s) only.
See application file for complete search history.

(56) References Cited

U.S. PATENT DOCUMENTS 5,173,766 A 12/1992 Long et al.
5,986,334 A 11/1999 Lee
(Continued)

FOREIGN PATENT DOCUMENTS

| CN | 204966479 U | 1/2016 |
|---|---|---|
| JP | 10-308477 A | 11/1998 |
| JP | 2010-153519 A | 7/2010 |

OTHER PUBLICATIONS

Taiwanese Office Action dated Mar. 6, 2019 issued in Taiwanese Patent Application No. 107114905 (with English translation).

*Primary Examiner* — Ratisha Mehta
(74) *Attorney, Agent, or Firm* — Sughrue Mion, PLLC

(57) ABSTRACT

A semiconductor package includes: a connection member having first and second surfaces opposing each other and including a redistribution layer; a support member disposed on the first surface of the connection member, including a cavity, and having an inner sidewall surrounding the cavity of which an upper region is chamfered; a semiconductor chip disposed on the connection member in the cavity and having connection pads electrically connected to the redistribution layer; at least one electronic component disposed between the semiconductor chip and the inner sidewall and having connection terminals electrically connected to the redistribution layer; and an encapsulant encapsulating the semiconductor chip and the at least one electronic component disposed in the cavity.

16 Claims, 14 Drawing Sheets

(51) Int. Cl.
*H01L 23/00* (2006.01)
*H01L 21/48* (2006.01)
*H01L 21/56* (2006.01)

(52) U.S. Cl.
CPC .................. *H01L 2924/181* (2013.01); *H01L 2924/19105* (2013.01); *H01L 2924/3511* (2013.01)

(56) References Cited

U.S. PATENT DOCUMENTS

2014/0217597 A1   8/2014  Lin et al.
2015/0084206 A1   3/2015  Lin
2015/0255427 A1*  9/2015  Sung .................. H01L 23/5384
                                                                    257/737

\* cited by examiner

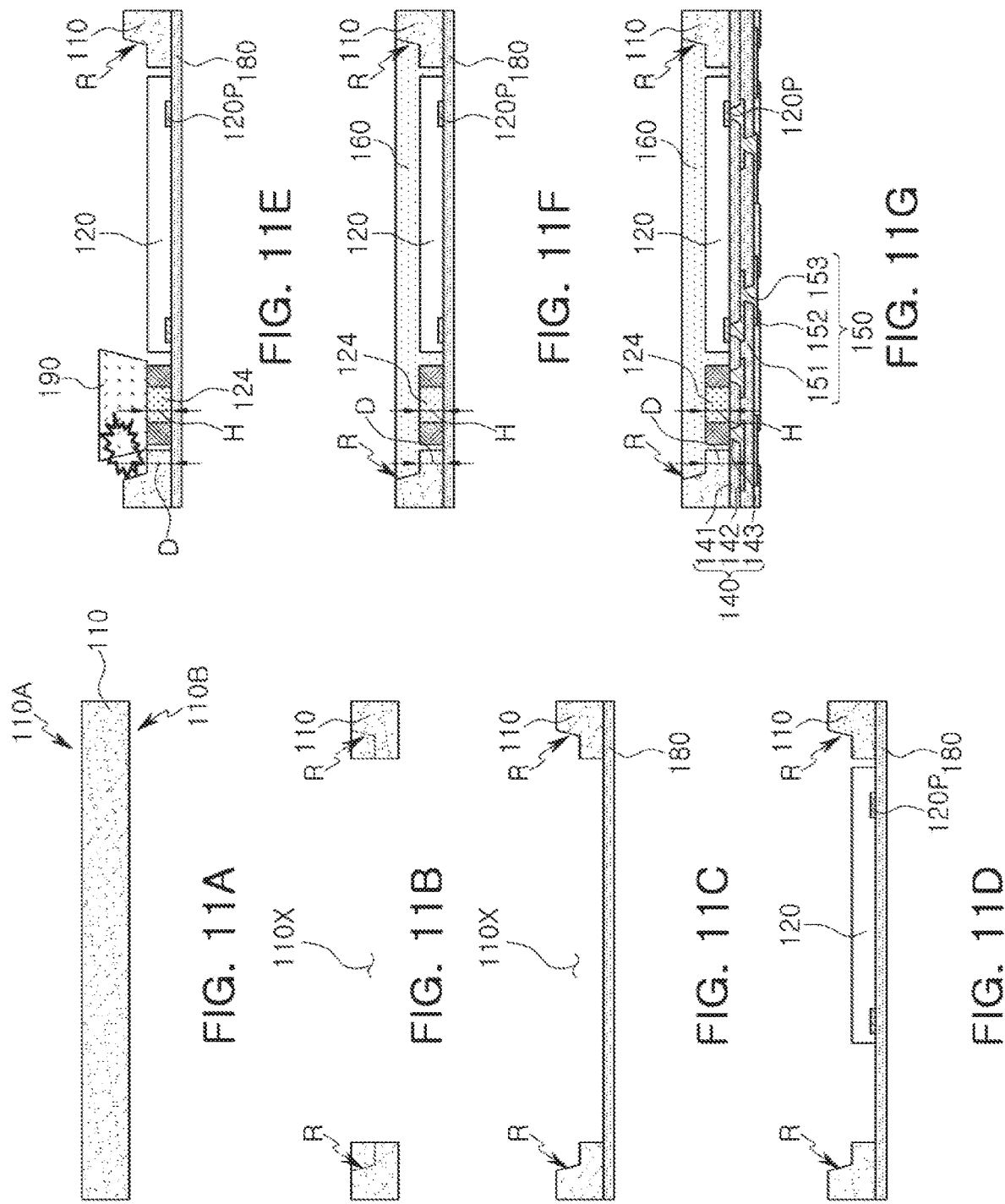

SEMICONDUCTOR PACKAGE

CROSS-REFERENCE TO RELATED APPLICATION(S)

This application claims the benefit of priority to Korean Patent Application No. 10-2017-0135951, filed on Oct. 19, 2017 in the Korean Intellectual Property Office, the disclosure of which is incorporated herein by reference in its entirety.

BACKGROUND

1. Field

The present disclosure relates to a semiconductor package.

2. Description of Related Art

Semiconductor packages have been continuously required to be thinned and lightened in terms of a shape and weight, and have been required to be implemented in a system in package (SiP) form requiring complexity and multi-functionality in terms of function. In accordance with such a development trend, a fan-out wafer level package (FOWLP) has recently been prominent, and attempts to satisfy requirements of semiconductor packaging by applying several techniques to the FOWLP have been conducted.

In accordance with an increase in the number of electronic components embedded in the semiconductor packages, a defect may easily occur in a pick-and-place process using a nozzle. Particularly, in a process of mounting small elements such as passive elements, an alignment defect may be caused due to collision between the nozzle and a package structure.

SUMMARY

An aspect of the present disclosure may provide a semiconductor package in which a defect due to interference or a contact in a process of mounting an electronic component may be prevented and a resin for an encapsulant may be smoothly supplied.

According to an aspect of the present disclosure, a semiconductor package may be provided, in which a defect due to a contact may be prevented and a resin for an encapsulant may be smoothly supplied by processing a sidewall structure of a support member to which an electronic component is adjacent.

According to an aspect of the present disclosure, a semiconductor package may include: a connection member having first and second surfaces opposing each other and including a redistribution layer; a support member disposed on the first surface of the connection member, including a cavity, and having an inner sidewall surrounding the cavity, the inner sidewall including a chamfered upper region; a semiconductor chip disposed on the connection member in the cavity and having connection pads electrically connected to the redistribution layer; at least one electronic component disposed between the semiconductor chip and the inner sidewall and having connection terminals electrically connected to the redistribution layer; and an encapsulant encapsulating the semiconductor chip and the at least one electronic component disposed in the cavity.

According to another aspect of the present disclosure, a semiconductor package may include: a connection member having first and second surfaces opposing each other and including a redistribution layer; a support member disposed on the first surface of the connection member, including first and second cavities, and having a sidewall structure surrounding the first and second cavities; a semiconductor chip disposed on the connection member in the first cavity and having connection pads electrically connected to the redistribution layer; at least electronic component disposed in the second cavity and having connection terminals electrically connected to the redistribution layer; and an encapsulant encapsulating the semiconductor chip and the at least one electronic component disposed, respectively, in the first and second cavities, wherein the sidewall structure has a sidewall processing region in which a width of an upper region of the sidewall structure is greater than that of a lower region thereof so that an upper space of the second cavity is extended in a region of the sidewall structure adjacent to the at least one electronic component.

BRIEF DESCRIPTION OF DRAWINGS

The above and other aspects, features, and advantages of the present disclosure will be more clearly understood from the following detailed description taken in conjunction with the accompanying drawings, in which:

FIGS. 11A through 11G are cross-sectional views for describing main processes of a method of manufacturing the semiconductor package illustrated in FIG. 9;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
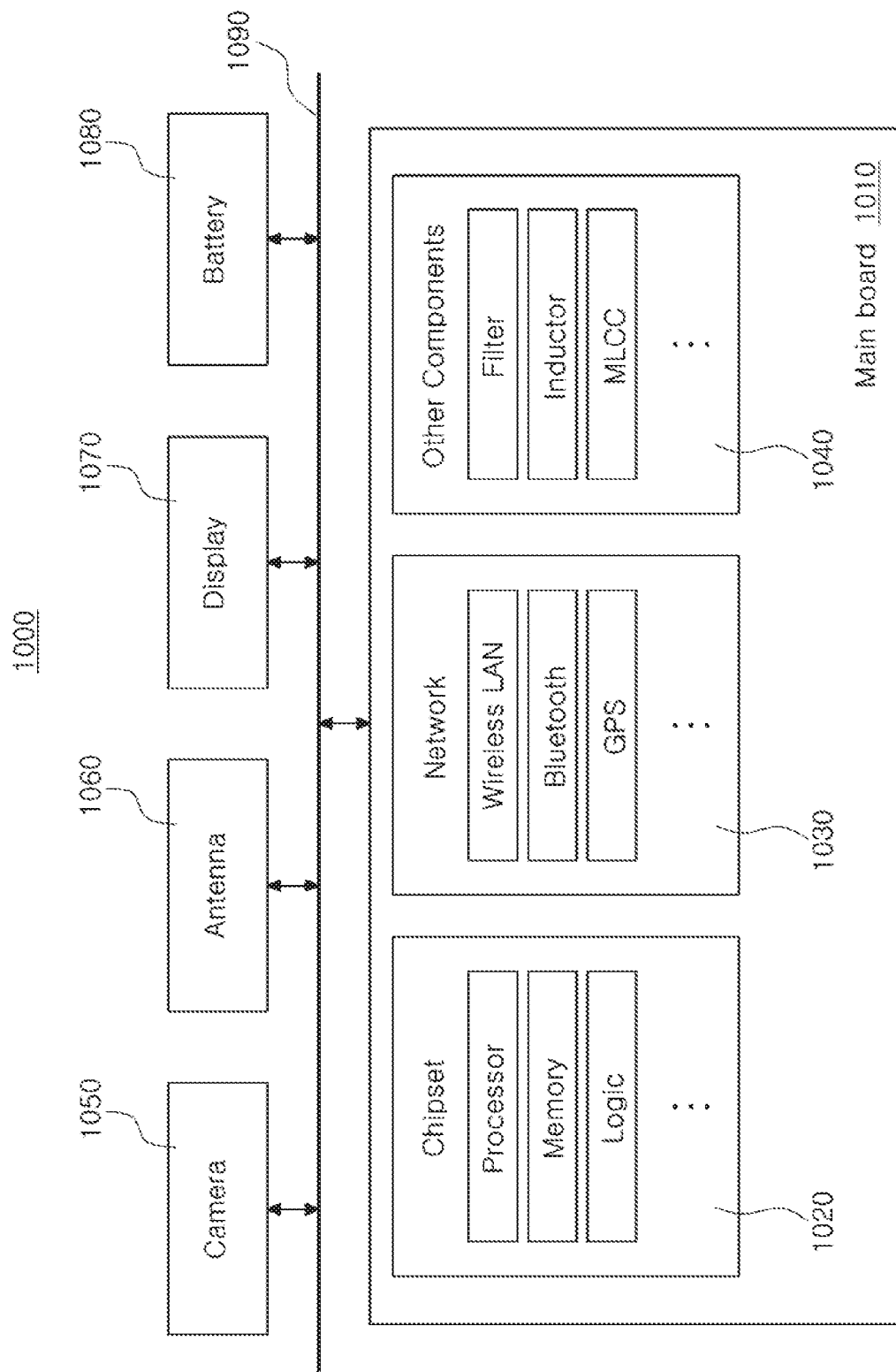
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
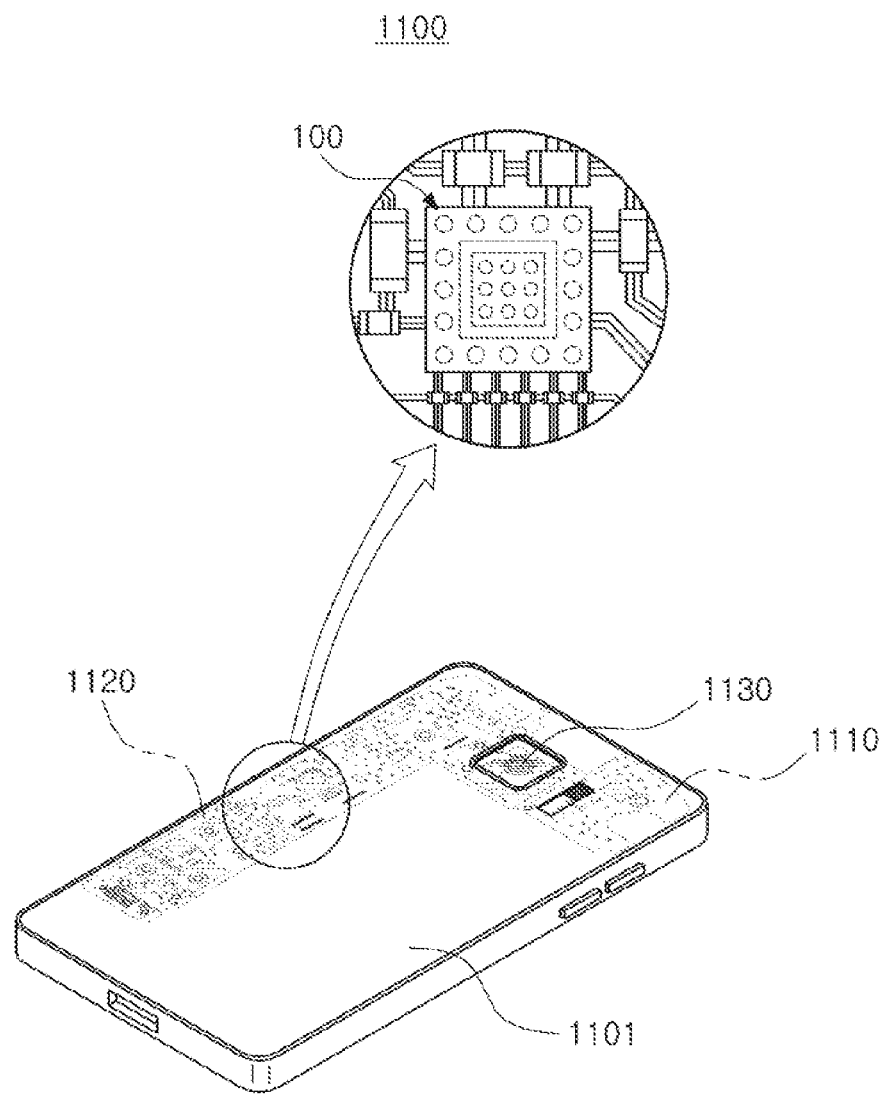
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip-related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

Semiconductor packaging is required because there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
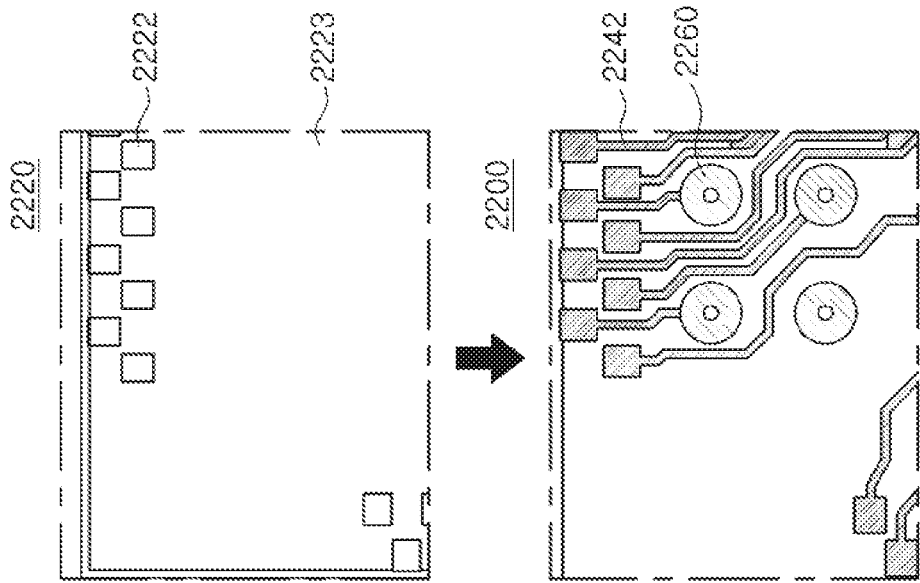
FIGS. 3A and 3B are schematic cross-sectional views illustrating states of a fan-in semiconductor package before and after being packaged.
Figure 3A:
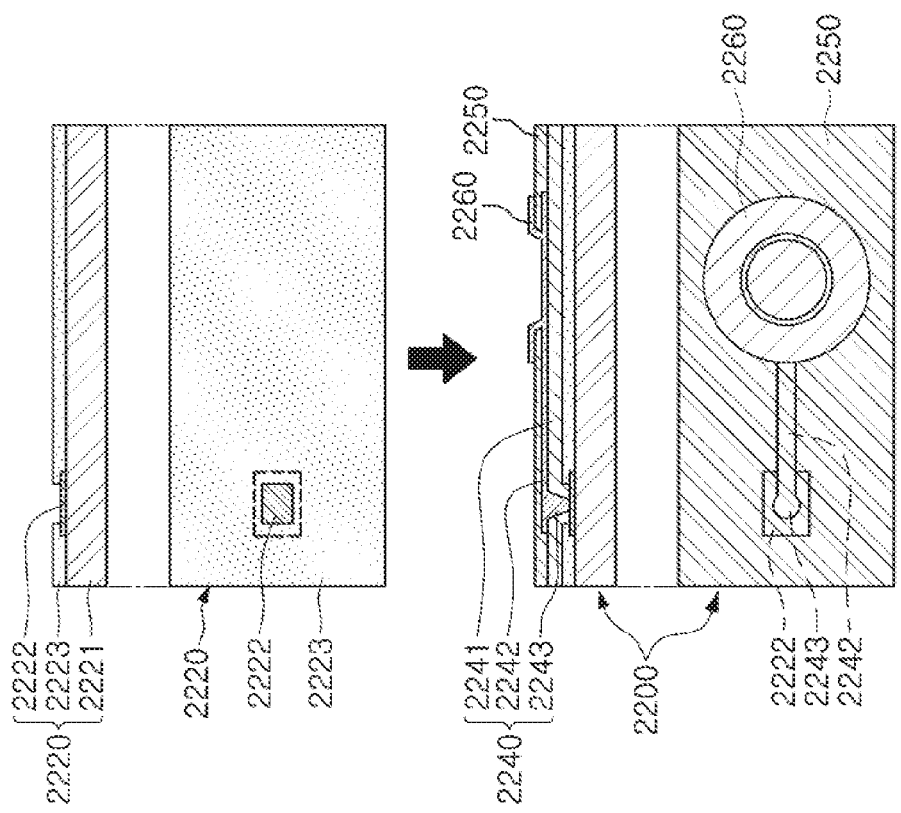
Figure 4:
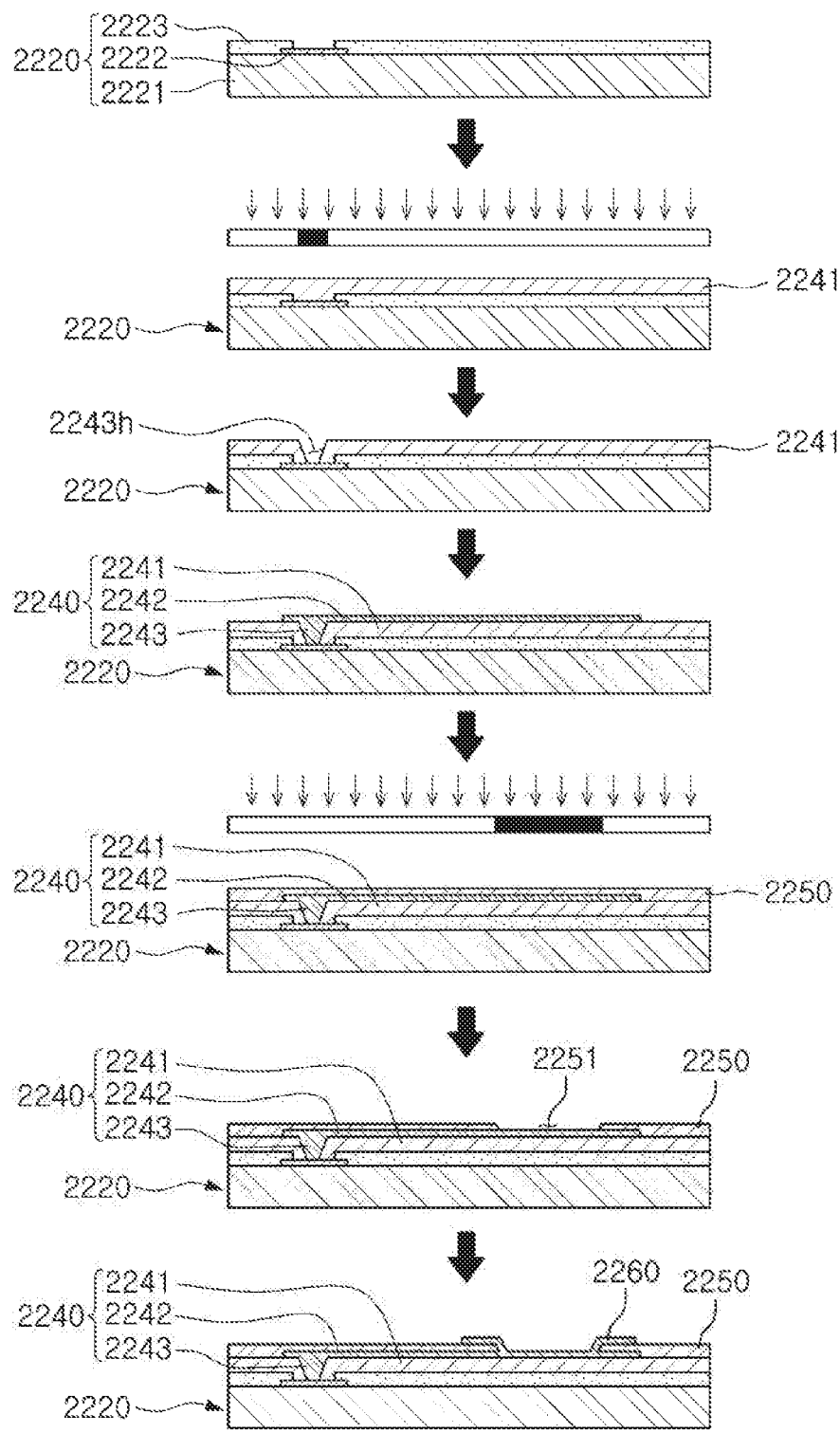
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
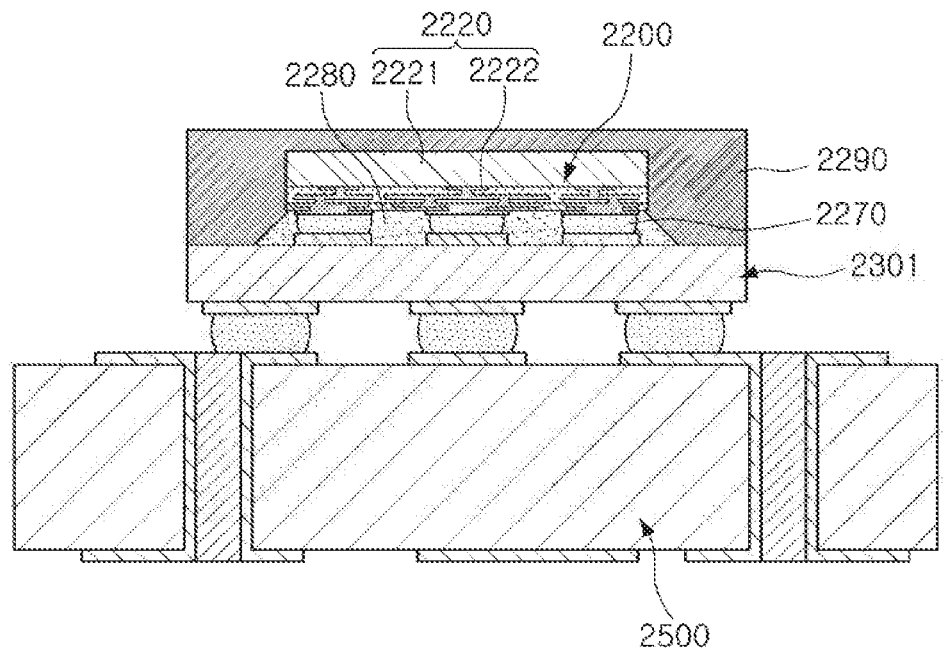
FIG. 5 is a schematic cross-sectional view illustrating a case in which a fan-in semiconductor package is mounted on an interposer substrate and is ultimately mounted on a mainboard of an electronic device.
Figure 6:
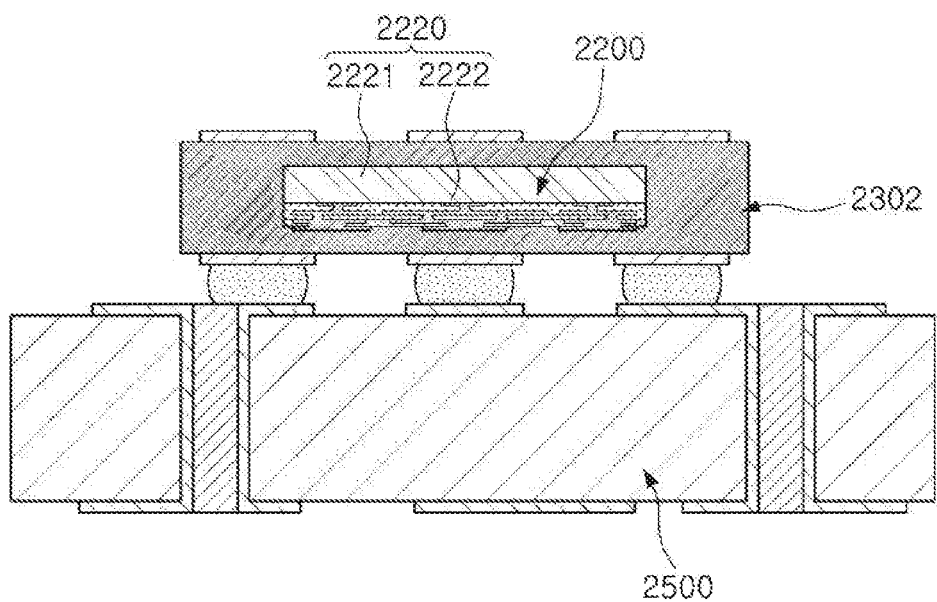
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
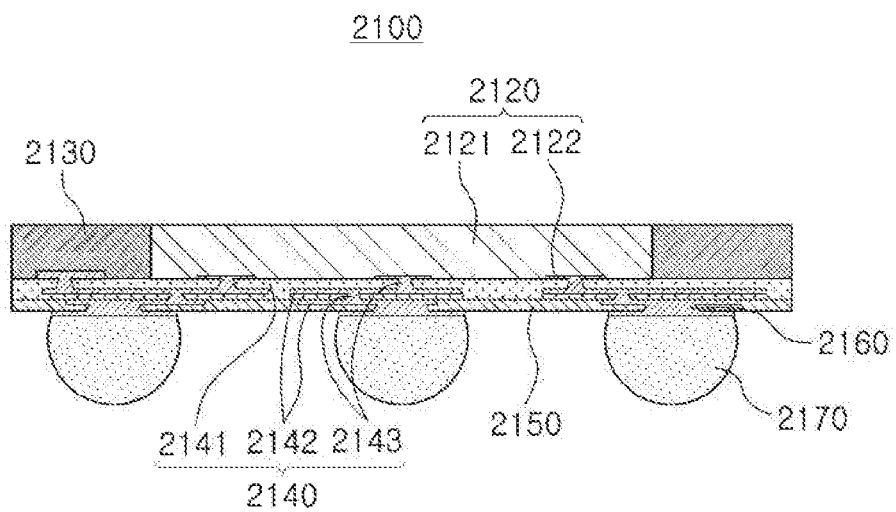
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
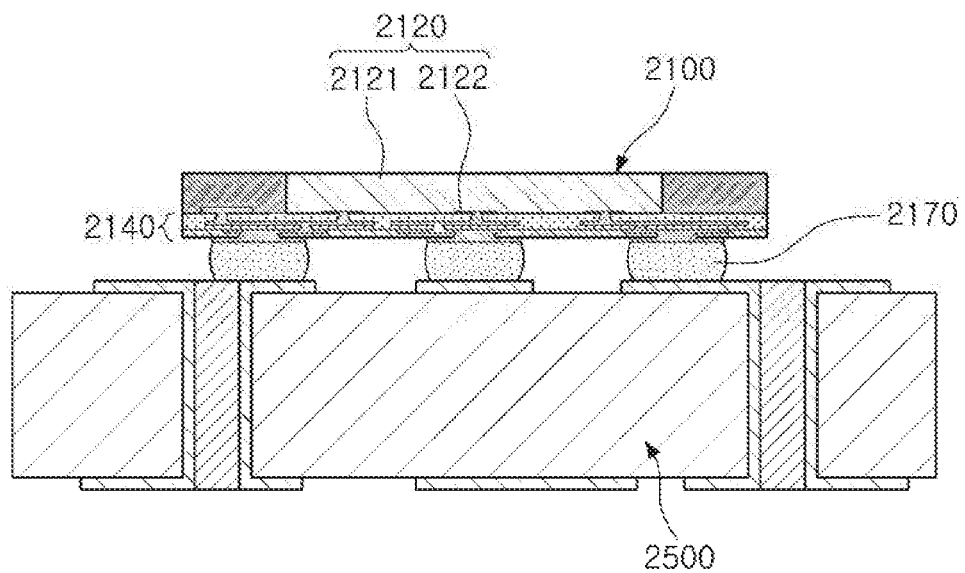
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

The fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A semiconductor package in which a defect occurring at the time of mounting an electronic component may be prevented and a molding material for an encapsulant may be smoothly supplied by processing an inner sidewall of a support member will hereinafter be described with reference to the accompanying drawings.

Figure 9:
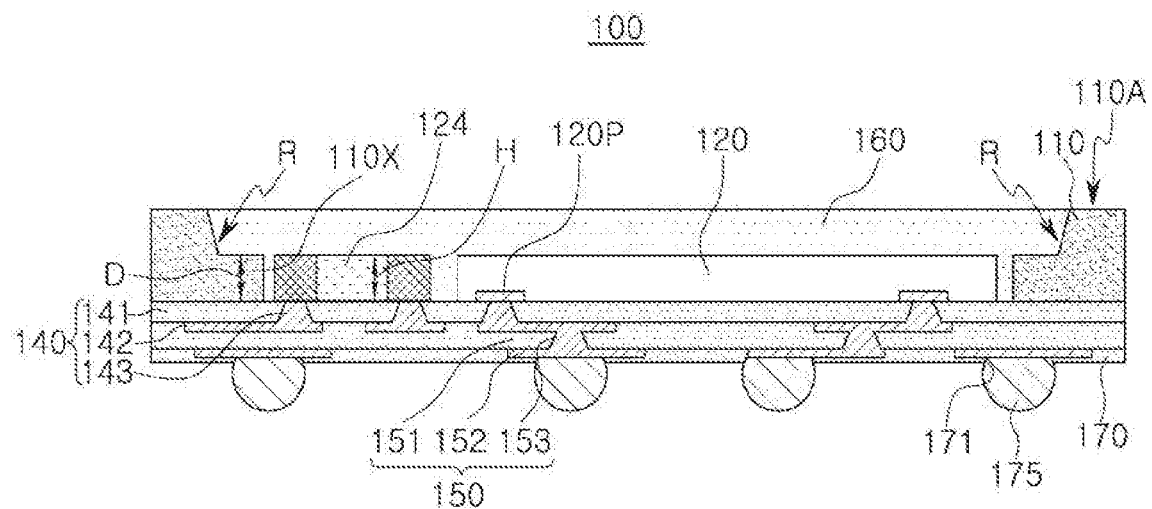
FIG. 9 is a plan view illustrating a semiconductor package according to an exemplary embodiment in the present disclosure.
Figure 10:
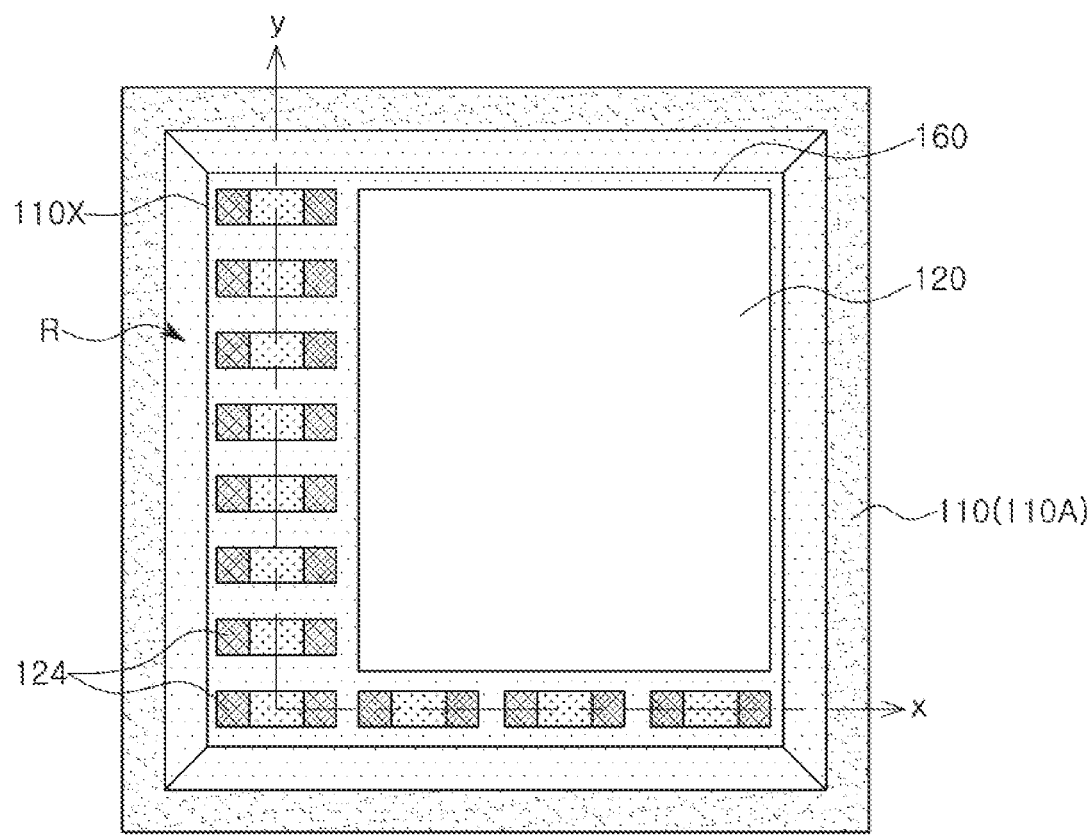
FIG. 10 is a side cross-sectional view taken along line A-A' of the semiconductor package illustrated in FIG. 9.

FIG. 9 is a plan view illustrating a semiconductor package according to an exemplary embodiment in the present disclosure, and FIG. 10 is a side cross-sectional view taken along line A-A' of the semiconductor package illustrated in FIG. 9.

Referring to FIGS. 9 and 10, a semiconductor package 100 according to the present exemplary embodiment may include connection members 140 and 150 including redistribution layers 142 and 152, respectively, a support member 110 disposed on the connection members 140 and 150 and having a cavity 110X, a semiconductor chip 120 disposed on the connection members 140 and 150 in the cavity 110X, and an encapsulant 160 encapsulating the semiconductor chip 120 positioned in the cavity 110X.

The semiconductor package 100 may include a plurality of electronic components 124 disposed in the cavity 110X.

The semiconductor chip 120 and the plurality of electronic components 124 may be mounted in the cavity 110X, and connection pads 120P of the semiconductor chip 120 and connection terminals of the plurality of electronic components 124 may be electrically connected to the redistribution layers 142 and 152.

The semiconductor chip 120 may have an area relatively greater than those of the electronic components 124. The plurality of electronic components 124 may be disposed in a space between inner sidewalls of the support member 110 and the semiconductor chip 120. In the present exemplary embodiment, as illustrated in FIG. 10, the plurality of electronic components 124 may be mounted along a space between two edges of the semiconductor chip 120 and the inner sidewalls of the support member 110.

In the support member 110 used in the present exemplary embodiment, upper regions of all the inner sidewalls surrounding the cavity 110X may have chamfered upper regions (or referred to as 'sidewall processing regions') R. As illustrated in FIG. 9, the chamfered upper regions R may have a step with respect to lower regions of the inner sidewalls. The "chamfered upper regions" refer to chamfered upper end regions, and are used as the meaning including a form in which the upper regions of the inner sidewalls are processed to have a width greater than that of the lower regions of the inner sidewalls so that an upper space of the cavity is extended.

The chamfered upper regions R may extend the upper space of the cavity 110X. Due to the extension of the upper space of the cavity, the probability that the inner sidewall and a nozzle will collide with each other when the electronic component 124 is mounted adjacent to the inner sidewall using the nozzle may be significantly reduced.

As a thickness D of the lower regions of the inner sidewalls becomes low, the probability that the inner sidewall and the nozzle will collide with each other may be reduced, but since a space exists between a mounting region of the electronic components 124 and the inner sidewalls and a cross section of the nozzle has mainly a reverse trapezoidal shape, when the thickness D of the lower regions of the inner sidewalls is three or less times the mounting height H of the electronic components 124, the probability that the inner sidewall and the nozzle will collide with each other may be effectively reduced.

In addition, the chamfered upper regions R may be used in all the inner sidewalls surrounding the cavity 110X to significantly extend the upper space of the cavity 110X. Particularly, an effect of extending spaces between the inner sidewalls of the support member 110, and the electronic components 124 and the semiconductor chip 120 may be generated, and a molding material for the encapsulant 160 may thus be effectively injected up to regions adjacent to the inner sidewalls when the molding material is supplied. Resultantly, the semiconductor chip 120 and the electronic components 124 may be stably bound to the support member.

In the present exemplary embodiment, a form of the support member 110 in which the upper regions of all the inner sidewalls surrounding the cavity 110X have the chamfered upper regions R is illustrated. However, the support member 110 is not limited thereto, and sidewall regions to which the plurality of electronic components 124 are adjacent may have the chamfered upper regions R. For example, in a case of an array of the plurality of electronic components 124 according to the present exemplary embodiment, two sidewalls may have the chamfered upper regions R. Particularly, when the electronic components 124 have a rectangular structure, the probability that the sidewall and the nozzle will collide with each other may be higher in an array in a y direction than in an array in an x direction in FIG. 10. In this case, the chamfered upper regions R may be formed in only inner sidewalls adjacent to the array in the y direction.

The semiconductor chip 120 may include a memory chip such as a volatile memory, a non-volatile memory, a flash memory, or the like; an application processor chip such as a central processor (for example, a CPU), a graphics processor, a digital signal processor, a cryptographic processor, a microprocessor, a microcontroller, or the like; and a logic chip such as ADC converter, an ASIC, or the like.

The plurality of electronic components 124 may include various passive elements such as a high frequency inductor, a ferrite inductor, a power inductor, a ferrite beads, an LTCC, an EMI filter, and a MLCC, but are not limited thereto. For example, the plurality of electronic components 124 may be network-related electronic components as well as passive components.

The respective components included in the semiconductor package 100 according to the present exemplary embodiment will hereinafter be described in more detail.

The support member 110 may maintain rigidity of the semiconductor package 100. The semiconductor chip 120 disposed in the cavity 110X of the support member 110 may be fixed by the encapsulant 160. The support member 110 may provide an extended routing region to the semiconductor package 100, and improve a degree of freedom in a design. Unlike the present exemplary embodiment, the support member may have a specific wiring structure (see FIGS. 13 and 14A).

An insulating material may be used as a material of the support member 110. In this case, the insulating material may be a thermosetting resin such as an epoxy resin, a thermoplastic resin such as a polyimide resin, a resin in which a thermosetting resin or a thermoplastic resin is impregnated in a reinforcement material such as a glass fiber and/or an inorganic filler, for example, prepreg, Ajinomoto Build up Film (ABF), FR-4, Bismaleimide Triazine (BT), or the like. Alternatively, a photosensitive insulating material such as a photoimagable dielectric (PID) resin may be used the insulating material. As another example, a metal having excellent rigidity and thermal conductivity may be used. In this case, an Fe—Ni based alloy may be used as the metal. In this case, Cu plating may also be formed on a surface of the Fe—Ni based alloy in order to secure adhesion between the Fe—Ni based alloy and the encapsulant 160, another interlayer insulating material, and the like. The support member 110 is not limited thereto, but may also be formed of glass, ceramic, plastic, or the like.

The connection members 140 and 150 may be configured to basically redistribute the connection pads 120P of the semiconductor chip 120. Several tens to several hundreds of connection pads 120P having various functions may be redistributed by the connection members 140 and 150, and may be physically and/or electrically connected to an external apparatus through connection terminals 175. The connection members 140 and 150 may be connected to the connection pads 120P of the semiconductor chip 120, and support the semiconductor chip 120.

In the present exemplary embodiment, the connection members 140 and 150 may include a first redistribution layer 142 disposed on a first insulating layer 141 and a second redistribution layer 152 disposed on a second insulating layer 151, respectively. The first redistribution layer 142 may be connected to the connection pads 120P of the semiconductor chip 120 by first vias 143 formed in the first insulating layer 141, and the second redistribution patterns 152 may be connected to the first redistribution patterns 142 by second vias 153 formed in the second insulating layer 151. The redistribution layers are not limited thereto, but may include a single layer or layers more than those described above.

The insulating layer 151 may include a thermosetting resin such as an epoxy resin, a thermoplastic resin such as a polyimide resin, a resin in which a thermosetting resin or a thermoplastic resin is impregnated in a reinforcement material such as an inorganic filler, similar to the above-mentioned other insulator, and a photosensitive insulating material such as a PID resin may be used as a material of the insulating layer 151. The first and second redistribution layers 142 and 152 and the first and second vias 143 and 153 may include a conductive material such as copper (Cu), aluminum (Al), silver (Ag), tin (Sn), gold (Au), nickel (Ni), lead (Pb), or alloys thereof.

The encapsulant 160 may be configured to protect the semiconductor chip 120. In the present exemplary embodiment, an encapsulation form of the encapsulant 160 is not particularly limited, but may be a form in which the encapsulant 160 surrounds the semiconductor chip 120. For example, the encapsulant 160 may cover the semiconductor chip 120, and may fill the remaining space within the cavity 110X of the support member 110. As described above, the chamfered upper regions R may be used to effectively fill such a space by the encapsulant 160. The encapsulant 160 may fill the cavity 110X to thus serve as an adhesive and reduce buckling of the semiconductor chip 120. The encapsulant 160 may cover all surfaces of the semiconductor chip 120 except for a lower surface of the semiconductor chip 120. The encapsulant 160 may cover only portions of the lower surface of the semiconductor chip 120 depending on positions and shapes of the connection pads 120P of the semiconductor chip 120. In some exemplary embodiments, the encapsulant 160 may include a plurality of layers formed of a plurality of materials. For example, a space in the cavity 110X may be filled with a first encapsulant, and a first surface 110A of the support member 110 and the semiconductor chip 120 may be covered with a second encapsulant different from the first encapsulant. A material of the encapsulant 160 is not particularly limited, but may be a thermosetting resin such as an epoxy resin, a thermoplastic resin such as a polyimide resin, a resin in which a thermosetting resin or a thermoplastic resin is impregnated in a reinforcement material such as a glass fiber and/or an inorganic filler, for example, prepreg, ABF, or the like. In addition, the known molding material such as an epoxy molding compound (EMC), or the like, may be used. In some exemplary embodiments, a material including a glass fiber and/or an inorganic filler and an insulating resin may be used as a material of the encapsulant 160 to effectively suppress warpage of the semiconductor package. In some exemplary embodiments, the encapsulant 160 may include conductive particles in order to block electromagnetic waves. For example, the conductive particles may include copper (Cu), aluminum (Al), silver (Ag), tin (Sn), gold (Au), nickel (Ni), lead (Pb), solder, or the like, but are not limited thereto.

The semiconductor package 100 according to the present exemplary embodiment may further include a passivation layer 170 disposed beneath the connection member 150. The passivation layer 170 may be configured to protect the connection members 140 and 150 from external physical or chemical damage. The passivation layer 170 may have openings 171 exposing at least portions of the second redistribution layer 152 of the connection member 150. A material of the passivation layer 170 is not particularly limited, but may be, for example, a solder resist. In some exemplary embodiments, a material (for example, a PID resin, ABF, or the like) that is the same as or similar to the insulating material used as the material of the support member 110 and/or the connection member 150 may be used as the material of each of the passivation layer 170.

The semiconductor package 100 according to the present exemplary embodiment may further include the connection terminals 175 disposed in the openings 171 of the passivation layer 170 and externally exposed. The connection terminals 175 may be configured to physically or electrically connect the semiconductor package 100 to the external apparatus. For example, the semiconductor package 100 may be mounted on the motherboard of the electronic device through the connection terminals 175. In some exemplary embodiments, an additional underbump metallurgy (UBM) layer may be formed on the second redistribution layer 152, and the connection terminals 175 may be formed. For example, the connection terminals 175 may be formed of copper (Cu), aluminum (Al), silver (Ag), tin (Sn), gold (Au), nickel (Ni), lead (Pb), solder, or the like, but are not limited thereto, and the connection terminals 175 may have various structures such as lands, balls, pins, and the like.

FIGS. 11A through 11G are cross-sectional views for describing main processes of a method of manufacturing the semiconductor package illustrated in FIG. 9.

Referring to FIG. 11A, a substrate used as the support member 110 may be prepared. The support member 110 may be an insulating substrate having first and second surfaces opposing each other. A material of the insulating substrate may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. When a material having high rigidity, such as prepreg including a glass fiber, or the like, is used as the material of the insulating substrate, the support member 110 may be utilized as a supporting means for controlling warpage of the semiconductor package 100.

Then, referring to FIG. 11B, the cavity 110X may be formed in the support member 110 in order to mount the semiconductor chip and the electronic components.

The cavity 110X may be formed using a mechanical drill and/or a laser drill. However, the cavity 110X is not limited thereto, and may also be formed by a sandblast method using particles for polishing, a dry etching method using plasma, or the like. When the cavity 110X is formed using the mechanical drill and/or the laser drill, a desmear process such as a permanganate method, or the like, may be performed to remove resin smear in the cavity 110X. In the present exemplary embodiment the chamfered upper regions R may be formed by removing upper edge regions (regions denoted by dotted lines) surrounding the cavity by an additional process. A process similar to a process of processing the cavity may be used as the additional process. For example, when a sandblast method or a dry etching method is used, the chamfered upper regions R may be formed using another mask so that inner sides of upper portions of desired sidewalls are additionally processed.

Then, referring to FIG. 11C, an adhesive film 180 may be attached to the second surface 110B of the support member 110.

Any material that may fix the first connection member 110 may be used as the adhesive film 108. As a non-restrictive example, any known tape, or the like, may be used. An example of any known tape may include a thermosetting adhesive tape of which adhesion is weakened by heat treatment, an ultraviolet-curable adhesive tape of which adhesion is weakened by ultraviolet ray irradiation, or the like.

Then, referring to FIG. 11D, the semiconductor chip 120 may be disposed in the cavity 110X of the support member 110.

The semiconductor chip 120 may be disposed on the adhesive film 180 in the cavity 110X in a face-down form in which the connection pads 120P are attached to the adhesive film 180. Before the electronic components having a relatively small area are mounted, the semiconductor chip 120 having a relative large area may be formed.

Then, referring to FIG. 11E, the electronic components 124 may be disposed in the cavity 110X of the support member 110.

In the present transfer process, which is a general pick-and-place process, a nozzle 190 transferring the electronic components 124 in a vacuum suction manner may be used. The electronic components 124 may be disposed in a relatively narrow space of the sidewalls surrounding the semiconductor chip 120 and the cavity 110X.

In the present transfer process, the nozzle 190 may be adjacent to the sidewall of the support member 110 when the nozzle 190 descends in order to dispose the electronic component 124. In this case, the upper space of the cavity is sufficiently secured by the chamfered upper regions R, and collision or interference between the nozzle 190 and the sidewall may be prevented. Resultantly, an alignment defect of the electronic components 124 that may occur due to the collision and the interference may be effectively prevented.

Then, referring to FIG. 11F, the semiconductor chip 120 and the electronic components 124 may be encapsulated using the encapsulant 160.

The encapsulant 160 may also fill effectively spaces between the semiconductor chip 120 and the electronic components 124, and the sidewalls by the chamfered upper regions R. The encapsulant 160 may be formed by any known method, or may be formed by applying a liquid-phase resin to the adhesive film 180 to encapsulate the semiconductor chip 120 and then hardening the liquid-phase resin. The semiconductor chip 120 and the electronic components 124 may be fixed to the support member 110 by such a hardening process. As a method of applying a liquid-phase resin, for example, a screen printing method of applying ink with a squeegee, a spray printing method of applying ink in a mist form, or the like, may be used. Alternatively, a lamination method may be used. For example, a method of performing a hot press process of pressing the liquid-phase resin for a predetermined time at a high temperature, decompressing the liquid-phase resin, and then cooling the liquid-phase resin to room temperature, cooling the precursor in a cold press process, and then separating a work tool, or the like, may be used.

Then, referring to FIG. 11G, the adhesive film 180 may be peeled off, and the connection members 140 and 150 may be formed on an active surface (a surface on which the connection pads 120P are disposed) of the semiconductor chip 120 and the second surface 110B of the support member.

A process of peeling off the adhesive film 180 is not particularly limited, but may be performed by any known method. For example, when the thermosetting adhesive tape of which the adhesion is weakened by the heat treatment, the ultraviolet-curable adhesive tape of which the adhesion is weakened by the ultraviolet ray irradiation, or the like, is used as the adhesive film 180, the adhesive film 180 may be peeled off after the adhesion of the adhesive film 180 is weakened by heat-treating the adhesive film 180 or may be peeled off after the adhesion of the adhesive film 180 is weakened by irradiating the adhesive film 180 with an ultraviolet ray. The connection members 140 and 150 may be obtained by sequentially forming the first insulating layer and first redistribution layer 141 and 142 and then forming the second insulating layer and second redistribution layer 151 and 152 and the vias 143 and 153 on and in the first and second insulating layers 141 and 151, respectively. The passivation layer 170 may be formed on the connection member 150.

Additionally, the passivation layer 170 may be formed, and the openings 171 may be formed in the passivation layer 170 so that portions of the second redistribution layer 152 are exposed, and the connection terminals 175 may be formed to manufacture the semiconductor package illustrated in FIG. 9. An underbump metal (UBM) layer may be formed before the connection terminals 175 are formed.

Figure 12A:
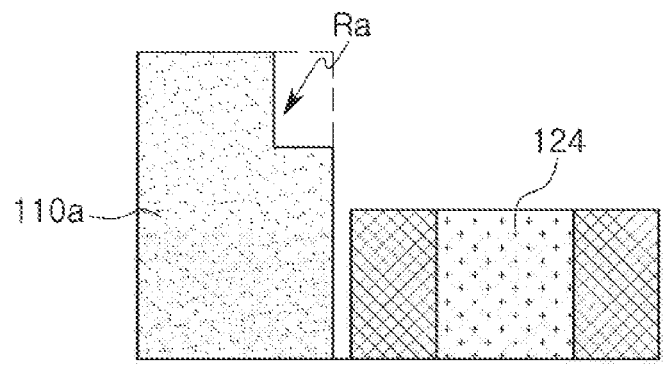
FIGS. 12A through 12C are cross-sectional views illustrating sidewall structures of various cores that may be used in exemplary embodiments in the present disclosure.
Figure 12B:
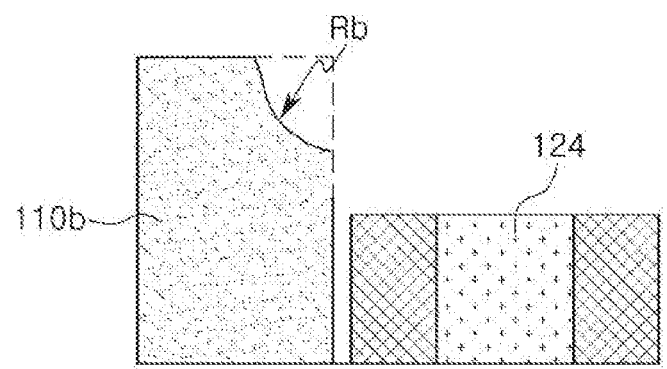
Figure 12C:
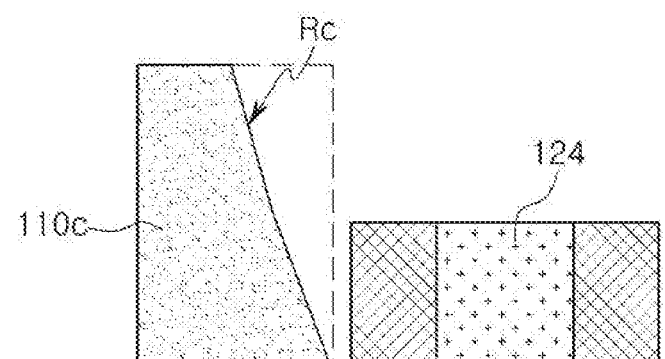

The chamfered upper regions that may be used in the present exemplary embodiment may have various shapes without being limited to a step structure as long as they may extend the upper space of the cavity. FIGS. 12A through 12C are cross-sectional views illustrating sidewall structures of various cores that may be used in exemplary embodiments in the present disclosure.

A support member 110a that may be used in the present exemplary embodiment may have a chamfered upper region Ra stepped in a vertical direction (see FIG. 12A). Unlike this, a support member 110b may have an upper region Rb having a cross section having a gently bent or curved shape (see FIG. 12B). If necessary, as in a support member 110c illustrated in FIG. 12C, an inner sidewall Rc having a generally gently processed surface may be provided by processing a portion of a lower region as well as an upper region.

These various shapes may be generated due to a different in a processing manner. For example, a gentle shape may be obtained by an etching process, and a vertical shape may be obtained by mechanical processing. A chamfered upper region having a desired shape may be prepared by selecting an appropriate process.

Unlike the present exemplary embodiment, the support member may include a wiring structure. In this case, there may be a limitation in chamfering an upper region. For example, processing an entire sidewall or an entire region of one edge may cause damage to the wiring structure. In consideration of this, the chamfered upper region may be provided in only a region adjacent to the electronic components. A semiconductor package 200 according to such an exemplary embodiment is illustrated in FIGS. 13 through 14B.

Figure 13:
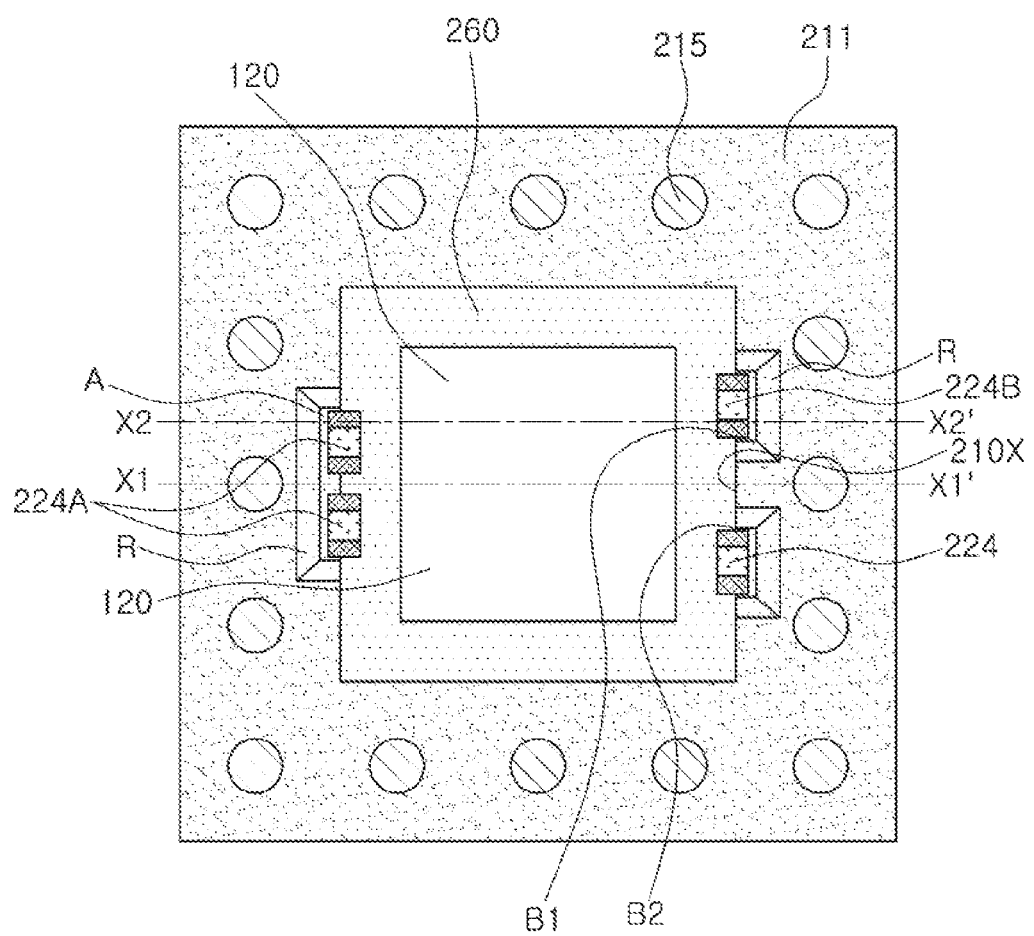
FIG. 13 is a plan view illustrating a semiconductor package according to another exemplary embodiment in the present disclosure.
Figure 14A:
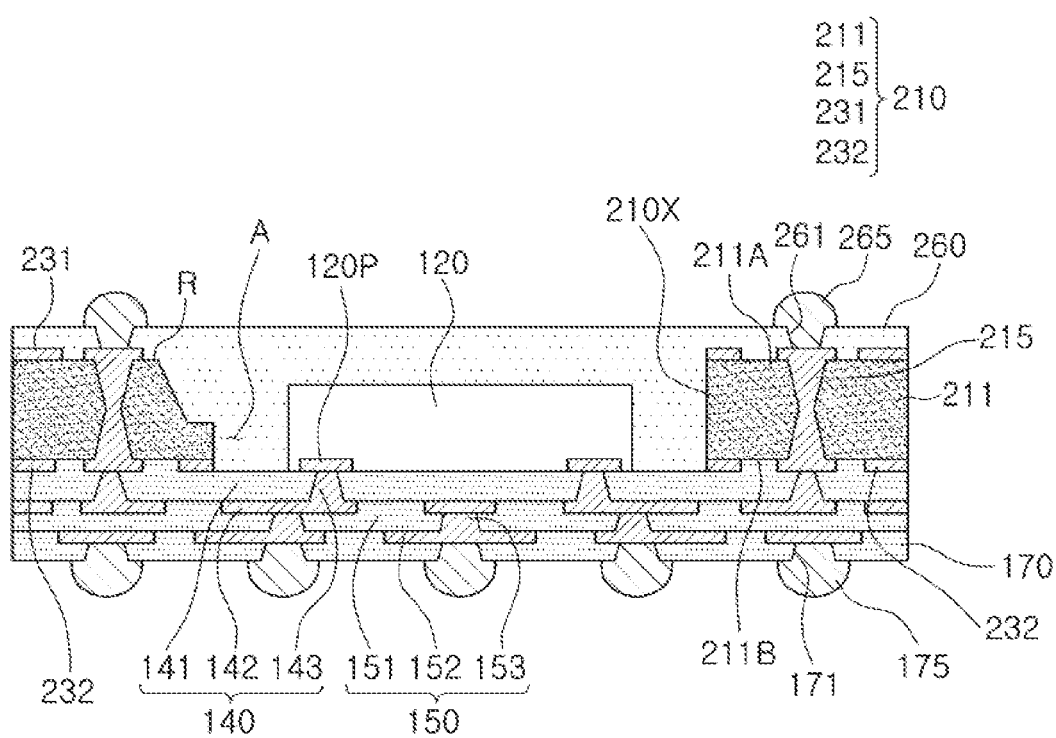
FIGS. 14A and 14B are, respectively, side cross-sectional views taken along line X1-X1' and line X2-X2' of the semiconductor package of FIG. 13.
Figure 14B:
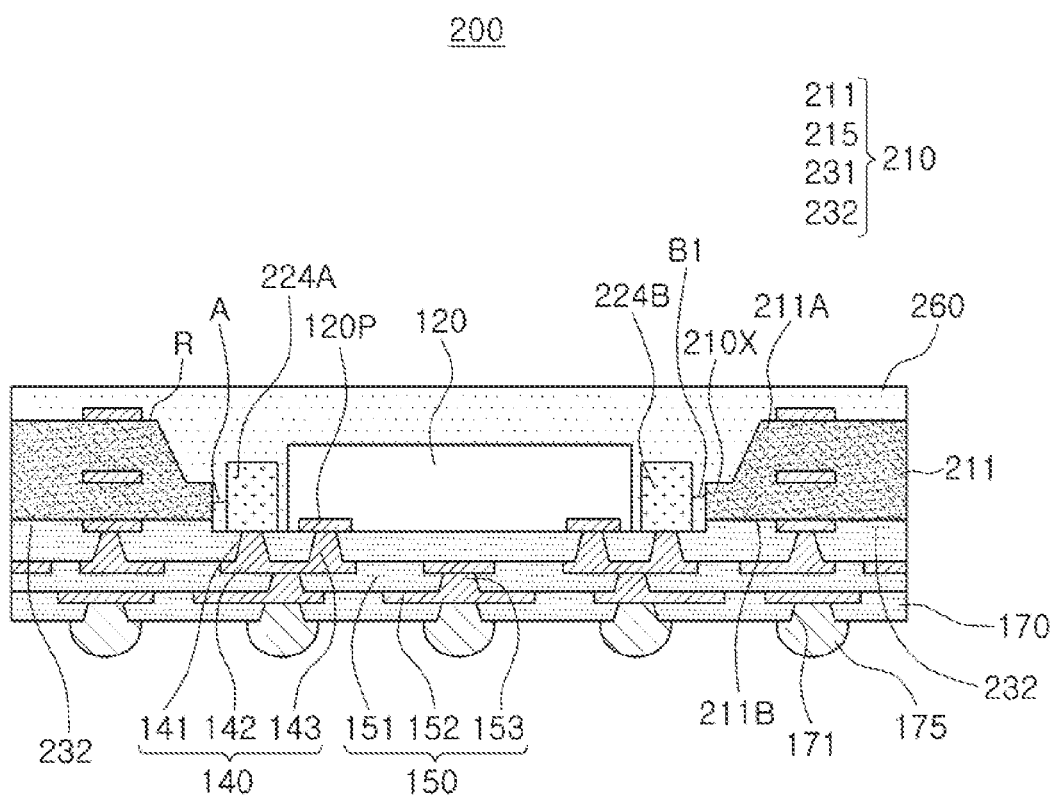

FIG. 13 is a plan view illustrating a semiconductor package according to another exemplary embodiment in the present disclosure, and FIGS. 14A and 14B are, respectively, side cross-sectional views taken along line X1-X1' and line X2-X2' of the semiconductor package of FIG. 13.

Referring to FIGS. 13, 14A and 14B, it may be understood that a semiconductor package 200 according to the present exemplary embodiment has a structure similar to that illustrated in FIGS. 9 and 10 except for a support member 210 having a wiring structure, and an array of a plurality of first and second electronic components 224A and 224B, and a difference of an inner sidewall structure depending on them. Components according to the present exemplary embodiments may be understood with reference to the description for the same or similar components of the semiconductor package 100 illustrated in FIGS. 9 and 10 unless explicitly described to the contrary.

The support member 210 used in the present exemplary embodiment may include an insulating substrate 210 having a first surface 211A and a second surface 211B opposing each other. The support member 210 may include the wiring structure implemented on the insulating substrate 211. The wiring structure may include first and second wiring patterns 231 and 232 disposed on the first and second surfaces 211A and 211B of the insulating substrate 211, respectively, and through-vias 215 connecting the first and second wiring patterns 231 and 232 to each other.

In the present exemplary embodiment, the second wiring patterns 232 of the support member 210 may be connected to a first redistribution layer 142 of a connection member 140 through first vias 143. An encapsulant 260 may cover an upper surface of the support member 210, and openings 261 may be formed so that some regions of the first wiring patterns 231 of the support member 210 are exposed. Additional connection terminals 265 may be formed in the openings 261.

As illustrated in FIG. 13, the semiconductor package 200 may include a semiconductor chip 220 and a plurality of first and second electronic components 224A and 224B disposed in a cavity 210X. Two first electronic components 224A may be disposed between the semiconductor chip 220 and one sidewall of the support member, and two second electronic components 224B may be disposed between the semiconductor chip 220 and the other sidewall of the support member.

Since the support member 210 used in the present exemplary embodiment includes the wiring structure, chamfered upper regions R may not be freely formed. Therefore, as illustrated in FIG. 13, in the present exemplary embodiment, the chamfered upper regions R may be provided in only inner sidewalls to which the first and second electronic components 224A and 224B are adjacent. If necessary, as in the present exemplary embodiment, first and second additional mounting portions A and B1 and B2 concavely recessed inwardly from the inner sidewalls may be provided in order to sufficiently prepare spaces for mounting the first and second electronic components 224A and 224B. The first additional mounting portion A may be provided as one space for the plurality of first electronic components 224A, while the second additional mounting portions B1 and B2 may be provided as a plurality of spaces for the plurality of second electronic components 224B, respectively. The second additional mounting portions B1 and B2 and the chamfered upper regions R provided in the second additional mounting portions B1 and B2 may be disposed between a plurality of through-vias 215.

The chamfered upper regions R and the first and second additional mounting portions A and B1 and B2 may additionally extend a lower space as well as an upper space of the cavity 210X. Particularly, when the support member having the wiring structure is used, an alignment defect due to impact of a nozzle, or the like, may be effectively prevented through local processing.

Figure 15:
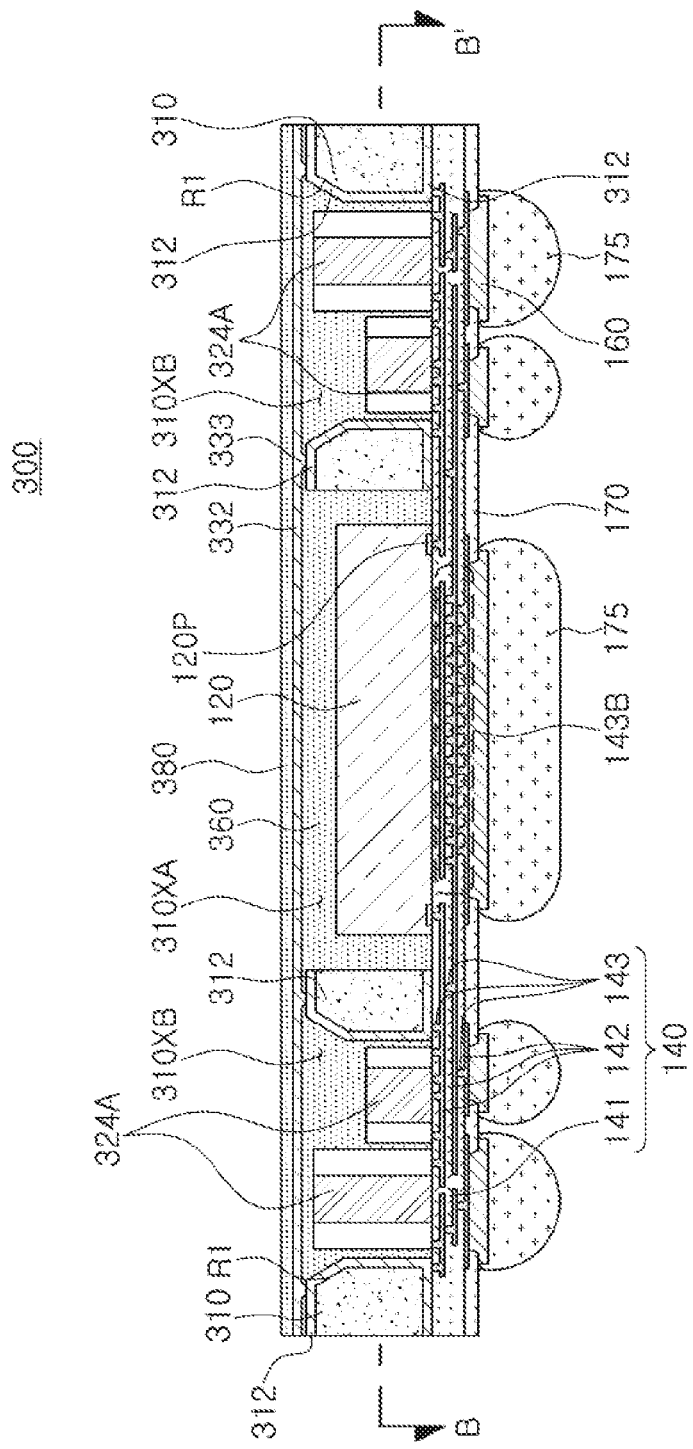
FIG. 15 is a side cross-sectional view illustrating a semiconductor package according to another exemplary embodiment in the present disclosure.
Figure 16:
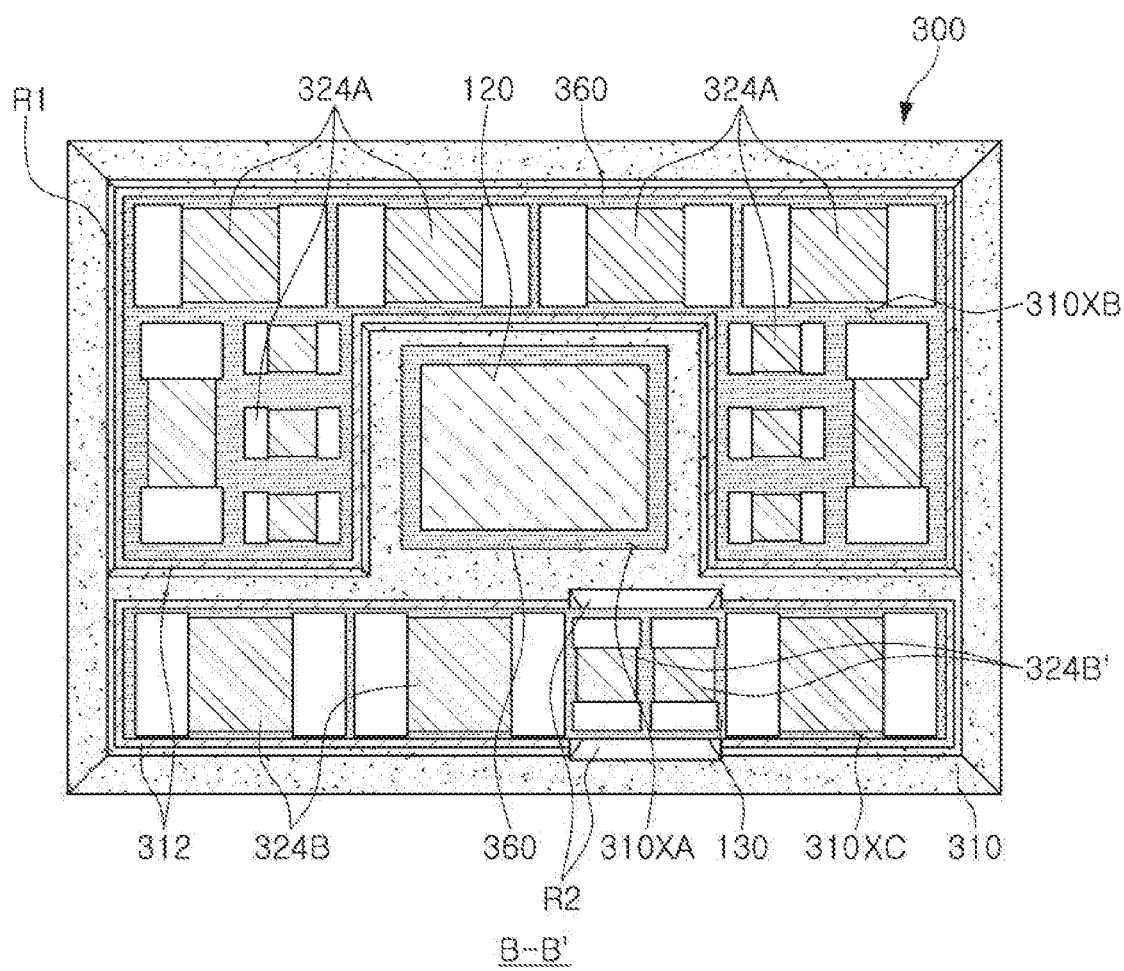
FIG. 16 is a plan view taken along line B-B' of the semiconductor package illustrated in FIG. 15.

FIG. 15 is a side cross-sectional view illustrating a semiconductor package according to another exemplary embodiment in the present disclosure, and FIG. 16 is a plan view taken along line B-B' of the semiconductor package illustrated in FIG. 15.

Referring to FIGS. 15 and 16, a semiconductor package 300 according to the present exemplary embodiment may include a support member 310 having first to third cavities 310XA, 310XB, and 310XC, a semiconductor chip 120 disposed in the first cavity 310XA and having connection pads 120P, one or more first electronic components 324A disposed in the second cavity 310XB, one or more second electronic components 324B disposed in the third cavity 310XC, and a connection member 140 disposed on the support member 310, the semiconductor chip 120, the first electronic components 324A, and the second electronic components 324B and including a redistribution layer 142 electrically connected to the connection pads 120P, the first electronic components 324A, and the second electronic components 324B. In addition, the semiconductor package 300 may further include an encapsulant 360 encapsulating the support member 310, the semiconductor chip 120, the first electronic components 324A, and the second electronic components 324B and filling remaining spaces of the first to third cavities 310XA, 310XB, and 310XC.

In the present exemplary embodiment, the semiconductor package 300 may further include a passivation layer 170 disposed on the connection member 140, an underbump metal layer 160 formed in openings of the passivation layer 170 and electrically connected to the redistribution layer 142, and electrical connection structures 175 electrically connected to the redistribution layer 142 through the underbump metal layer 160.

A metal layer 312 may be disposed on inner walls of sidewall structures of the first and second through-holes 310XB and 310XC, and may be extended to upper and lower surfaces of the support member 310. A backside metal layer 332 may be disposed on the encapsulant 360. The backside metal layer 332 may be connected to the metal layer 312 through backside vias 333 penetrating through at least portions of the encapsulant 360. A passivation layer 380 may be disposed on the backside metal layer 332.

As described above, the semiconductor chip 120 may be an integrated circuit (IC) provided in an amount of several hundred to several million or more elements integrated in a single chip. In this case, the integrated circuit may be, for example, a power management IC (PMIC), but is not limited thereto. The first and second electronic components 324A and 324B may be multilayer ceramic capacitors (MLCCs), low inductance chip capacitors (LICCs), inductors, beads, or various other kinds of filters, or the like, respectively. As illustrated in FIGS. 15 and 16, the first and second electronic components 324A and 324B may have different thicknesses and sizes.

As described above, the second and third cavities 310XB and 310XC may provide spaces for mounting the first and second electronic components 324A and 324B such as passive elements. In the present exemplary embodiment, a form in which two cavities are provided as the spaces for mounting the electronic components is illustrated, but in another exemplary embodiment, one cavity or another number of cavities may also be used.

Sidewall structures surrounding the second and third cavities 310XB and 310XC may have first and second sidewall processing regions R1 and R2 referred to as the chamfered upper regions in the exemplary embodiments described above. In detail, as illustrated in FIGS. 15 and 16, the first sidewall processing regions R1 may have a structure in which an upper region of the sidewall structure has a width smaller than that of a lower region of the sidewall structure so that an upper space of the second cavity 310XB is extended. Meanwhile, as illustrated in FIG. 16, the second sidewall processing regions R2 may have a form in which only a portion of the sidewall have an upper space of the third cavity 310XC extended.

The first and second sidewall processing regions R1 and R2 may be formed in regions adjacent to the first and second electronic components 324A and 324B in the sidewall structures surrounding the second and third cavities 310XB and 310XC. A form in which the plurality of electronic components are disposed in the first and second cavities 310XB and 310XC is illustrated, but a cavity for mounting one passive element may also be provided.

As illustrated in FIG. 16, in a case of the second cavity 310XB, a form in which the sidewall processing regions R1 are formed along all of the sidewall structures is illustrated. On the other hand, in a case of the third cavity 310XC, the second sidewall processing regions R2 may be formed in only some regions of the sidewall structures. In the present exemplary embodiment, the sidewall processing regions R2 used in the third cavity 310XC may be formed in only inner sidewalls adjacent to a width, in a longitudinal direction, of relatively small electronic components 324B' of the second electronic components 324B.

As set forth above, according to the exemplary embodiments in the present disclosure, a semiconductor package in which a defect due to interference or a contact in a process of mounting an electronic component may be prevented and a resin for an encapsulant may be smoothly supplied may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a connection member having a first surface and a second surface opposing the first surface, the connection member including a redistribution layer;
a support member disposed on the first surface of the connection member, including a cavity, the support member having an inner sidewall surrounding the cavity, and a chamfered upper region formed on a portion of the inner sidewall;
a semiconductor chip disposed on the connection member in the cavity and having connection pads electrically connected to the redistribution layer;
at least one electronic component disposed on a bottom surface of the cavity between the semiconductor chip and the chamfered upper region of the inner sidewall and having connection terminals electrically connected to the redistribution layer; and
an encapsulant encapsulating the semiconductor chip and the at least one electronic component disposed in the cavity,
wherein only the encapsulant is provided directly above an entirety of a lower surface of the chamfered upper region.

2. The semiconductor package of claim 1, wherein the at least one electronic component is a plurality of electronic components, and the chamfered upper region is a plurality of chamfered upper regions.

3. The semiconductor package of claim 2, wherein the plurality of chamfered upper regions are arranged to correspond to the plurality of electronic components, respectively.

4. The semiconductor package of claim 1, wherein the at least one electronic component is a plurality of electronic components, and
the plurality of electronic components are arranged along at least one side of the semiconductor chip.

5. The semiconductor package of claim 1, wherein the chamfered upper region surrounds the cavity.

6. The semiconductor package of claim 1, wherein portions of the inner sidewall do not include the chamfered upper region.

7. The semiconductor package of claim 1, wherein the chamfered upper region has a step with respect to a lower region of the inner sidewall.

8. The semiconductor package of claim 7, wherein a height of the lower region is three or less times the height of the electronic component adjacent to the inner sidewall.

9. The semiconductor package of claim 7, wherein the step with respect to the lower region of the inner sidewall comprises a lower surface and a sloped side surface.

10. The semiconductor package of claim 1, wherein the chamfered upper region has an inclined surface extending to the bottom a bottom surface of the cavity.

11. The semiconductor package of claim 1, wherein the support member has a plurality of through-vias connected to the redistribution layer and extended to an upper surface thereof.

12. The semiconductor package of claim 11, wherein the chamfered upper region is disposed between the plurality of through-vias.

13. The semiconductor package of claim 1, wherein a portion of the support member in which the chamfered upper region is disposed has a width smaller than those of other portions of the support member.

14. The semiconductor package of claim 1, wherein the chamfered upper region has a curved shape.

15. The semiconductor package of claim 1, wherein the electronic component is a passive electronic component.

16. The semiconductor package of claim 1, wherein the encapsulant is a resin layer.

* * * * *